(12) United States Patent
Teo

(10) Patent No.: US 6,958,650 B1
(45) Date of Patent: Oct. 25, 2005

(54) PUSH-PULL BUFFER/AMPLIFIER

(75) Inventor: Swee-Ann Teo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 61 days.

(21) Appl. No.: 10/744,184

(22) Filed: Dec. 23, 2003

Related U.S. Application Data

(60) Provisional application No. 60/470,603, filed on May 14, 2003.

(51) Int. Cl.[7] .............................................. H03F 3/45
(52) U.S. Cl. ...................................................... 330/252
(58) Field of Search ................................ 330/252, 255, 330/262, 295, 302

(56) References Cited

U.S. PATENT DOCUMENTS

| | | | |
|---|---|---|---|
| 5,581,212 A | 12/1996 | Huang et al. | 330/253 |
| 5,764,105 A | 6/1998 | Botker | 330/252 |
| 5,825,244 A | 10/1998 | Somayajula | 330/253 |
| 5,844,443 A | 12/1998 | Wong | 330/275 |
| 6,380,808 B1 | 4/2002 | Uasa et al. | 330/263 |
| 2002/0057132 A1 * | 5/2002 | Tomita | 330/252 |

FOREIGN PATENT DOCUMENTS

WO   WO 01/41300 A1   7/2001

* cited by examiner

Primary Examiner—Steven J. Mottola

(57) ABSTRACT

A differential circuit includes first, second, third, and fourth transistors each having a control terminal, a first terminal and a second terminal. A first input terminal communicates with the control terminals of the second and third transistors. A second input terminal communicates with the control terminals of the first and fourth transistors. A first output terminal communicates with the second terminal of the second transistor and the first terminal of the fourth transistor. A second output terminal communicates with the second terminal of the first transistor and the first terminal of the third transistor. The first input terminal communicates with the control terminals of the second and third transistors through first and second capacitances, respectively. The second input terminal communicates with the control terminals of the first and fourth transistors through third and fourth capacitances, respectively. A capacitance communicates with the second terminals of the third and fourth transistors.

20 Claims, 8 Drawing Sheets

US 6,958,650 B1

PUSH-PULL BUFFER/AMPLIFIER

CROSS-REFERENCE TO RELATED APPLICATION

This application claims the benefit of U.S. Provisional Application No. 60/470,603 filed May 14, 2003, which is hereby incorporated herein by reference in its entirety.

FIELD OF THE INVENTION

The present invention relates to buffer and amplifier circuits, and more particularly to buffer and amplifier circuits that drive low impedance capacitive loads at high frequencies.

BACKGROUND OF THE INVENTION

Buffer and amplifier circuits include emitter follower circuits of the type illustrated in FIG. 1. The emitter follower is typically characterized by a high input impedance and a low output impedance. Therefore, it is useful as an isolation or buffer amplifier (e.g., a unity gain buffer) for connecting a high impedance source to a low impedance load.

With further reference to FIG. 1, when control terminal $V_+$ is pulled sufficiently high, transistor $Q_1$ is biased on to provide a corresponding voltage at positive output terminal $V_{out+}$. When control terminal $V_+$ is pulled low, transistor $Q_1$ is biased off and transistor $Q_3$ draws current from a load (not shown) via the positive output terminal $V_{out+}$. Similarly, when control terminal $V_-$ is pulled high, transistor $Q_2$ is biased on to provide a corresponding voltage at negative output terminal $V_{out-}$. When control terminal $V_-$ is pulled low, transistor $Q_2$ is biased off and transistor $Q_4$ draws a current from the load via the negative output terminal $V_{out-}$.

One disadvantage of the circuit shown in FIG. 1 is that it consumes excessive power. Specifically, transistors $Q_3$ and $Q_4$ are biased on by the current source 102 and transistor $Q_5$. Therefore, when the control terminal $V_+$ is pulled high, transistor $Q_1$ provides the current drawn by transistor $Q_3$ in addition to providing current to the load via positive output terminal $V_{out+}$. Likewise, when the control terminal $V_-$ is pulled high, transistor $Q_2$ provides the current drawn by transistor $Q_4$ in addition to providing current to the load via the negative output terminal $V_{out-}$. Thus, the current drawn by transistors $Q_3$ and $Q_4$ when transistors $Q_1$ and $Q_2$, respectively, are on is wasted.

For high frequency applications involving capacitive (including partly capacitive) loads, the overall impedance of the capacitive load is typically low. Therefore, the transconductance of the transistors must be increased in order to drive the low impedance. Additionally, the bias current of the circuit shown in FIG. 1 must be sufficiently large such that the output stage is not slew limited. As frequency is increased, emitter followers of the type shown in FIG. 1 require additional current in order to drive low impedance loads.

FIG. 2 illustrates a known common-emitter differential amplifier. When control terminal $V_+$ is pulled low, transistor $Q_6$ is biased off such that current is provided from voltage supply $V_{cc}$ and through a resistor $R_1$ to a load via negative output terminal $V_{out-}$. Conversely, when control terminal $V_-$ is pulled low, transistor $Q_7$ is biased off such that current is provided from the voltage supply $V_{CC}$ and through a resistor $R_2$ to the load via positive output terminal $V_{out+}$.

In the case of capacitive loads, voltage supply $V_{CC}$ is essentially coupled to an RC circuit. The load represents the capacitance C of the RC circuit. Thus, as the value R of resistors $R_1$ and $R_2$ is increased, the bandwidth of the differential amplifier decreases. Specifically, the bandwidth of the amplifier is given by:

$$f_{BW}=1/2\pi RC$$

For high frequency applications, it is often desirable to have $f_{BW} \gg f_{opt}$, where $f_{opt}$ is the operating frequency. If R is too small, however, excessive current will be conducted through transistors $Q_6$ and $Q_7$. This is because the amplitude of the output is given by $i_{bias}R$. Assuming transistors $Q_6$ and $Q_7$ are fully switched such that the current is steered to any one side during operation, a relatively large current is required to have sufficient amplitude during high frequency operation.

Referring now to FIG. 3, a class B push-pull amplifier is shown. When control terminal $V_{in}$ is pulled high, transistor $Q_8$ is biased on and transistor $Q_9$ is biased off, resulting in transistor $Q_8$ "pushing" current to a load via output terminal $V_{out}$. Conversely, when control terminal $V_{in}$ is pulled low, transistor $Q_8$ is biased off and transistor $Q_9$ is biased on, resulting in transistor $Q_9$ "pulling" current from the load via the output terminal $V_{out}$.

The buffer of FIG. 3 is generally efficient in terms of current consumption as compared to the buffer/amplifiers of FIGS. 1 and 2. However, transistor $Q_9$ is typically a PNP bipolar junction transistor or a p-type MOS transistor. Because PNP bipolar junction transistors and p-type MOS transistors have less transconductance than their n-type counterparts, the buffer of FIG. 3 may either significantly load a previous stage to which the buffer is coupled, or the p-type transistor $Q_9$ may be so weak that output waveforms are distorted. Further, p-type devices typically have low $g_m$ values and therefore are generally not well suited for high frequency applications.

SUMMARY OF THE INVENTION

A differential circuit according to the present invention includes first, second, third, and fourth transistors each having a control terminal, a first terminal and a second terminal. A first input terminal communicates with the control terminals of the second and third transistors. A second input terminal communicates with the control terminals of the first and fourth transistors. A first output terminal communicates with the second terminal of the second transistor and the first terminal of the fourth transistor. A second output terminal communicates with the second terminal of the first transistor and the first terminal of the third transistor. The first input terminal communicates with the control terminals of the second and third transistors through first and second capacitances, respectively.

In other features, the second input terminal communicates with the control terminals of the first and fourth transistors through third and fourth capacitances, respectively. A capacitance communicates with the second terminals of the third and fourth transistors.

In still other features, a first bias current source communicates with the second terminal of the third transistor and one end of the capacitance. A second bias current source communicates with the second terminal of the fourth transistor an opposite end of the capacitance. At least one bias current source communicates with the second terminals of the third and fourth transistors. A capacitance communicates with the second terminals of the third and fourth transistors.

In yet other features, the bias current source communicates with the second terminal of the third transistor or the second terminal of the fourth transistor through the capacitance. The first terminals of the first and second transistors communicate with one or more supply voltage terminals. The differential circuit implements one of a unity gain buffer and an amplifier.

A method according to the present invention for driving a load that is connected across a pair of output terminals of a transistor circuit, which includes at least first and second transistors, includes pushing current to one of the output terminals with the first transistor. While performing the pushing step, current from the other one of the output terminals is pulled with the second transistor.

In other features, the transistor circuit includes third and fourth transistors. Current from the one of the output terminals is pulled with the third transistor while the fourth transistor pushes current to the other one of the output terminals.

In other features, the load is connected across the two output terminals of the transistor circuit. The load is at least partially capacitive.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF PREFERRED EMBODIMENTS

Figure 1:
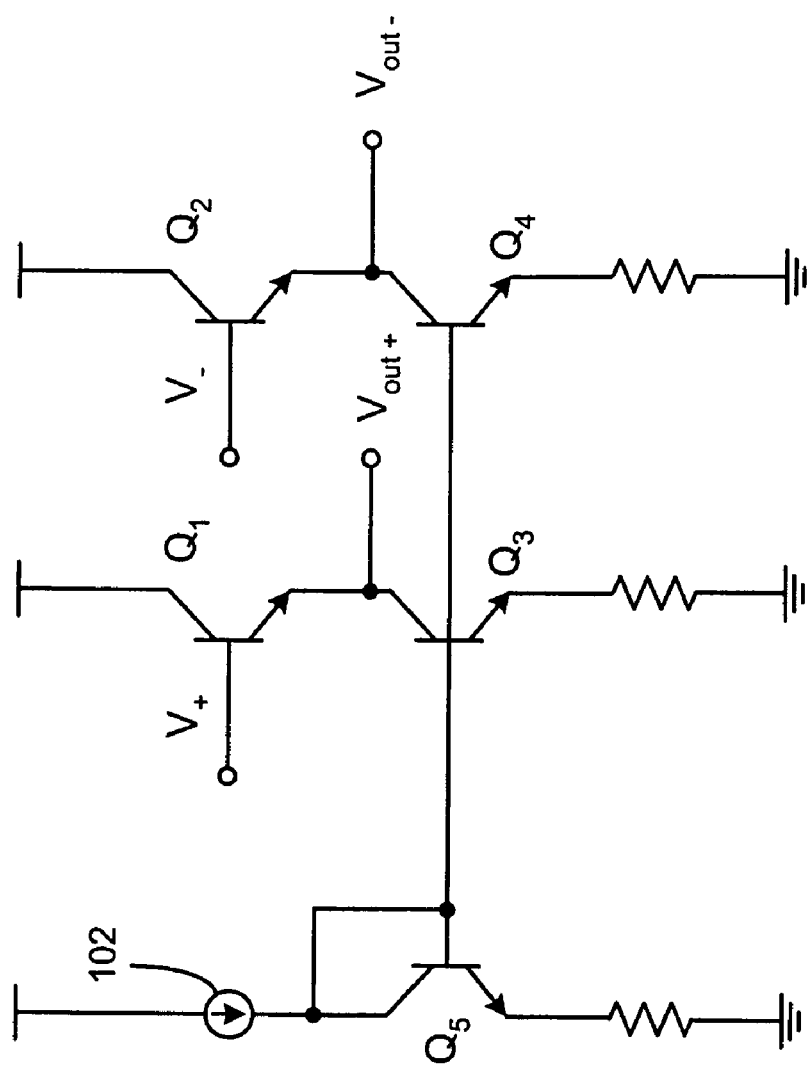
FIG. 1 is an electrical schematic of a prior art emitter follower circuit.
Figure 2:
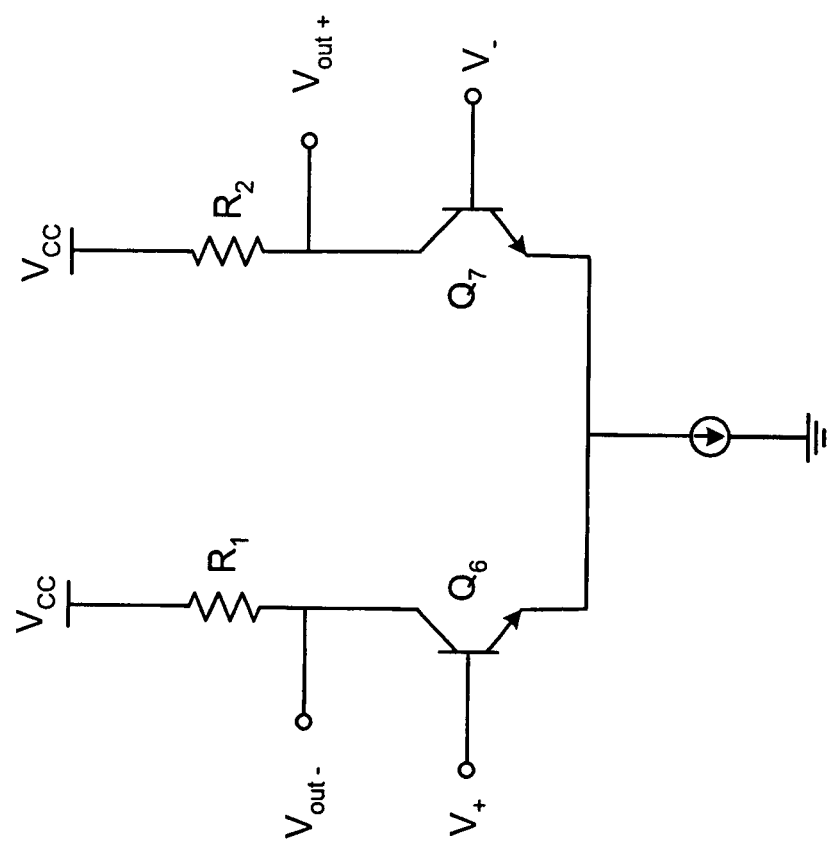
FIG. 2 is an electrical schematic of a prior art common-emitter differential amplifier circuit.
Figure 3:
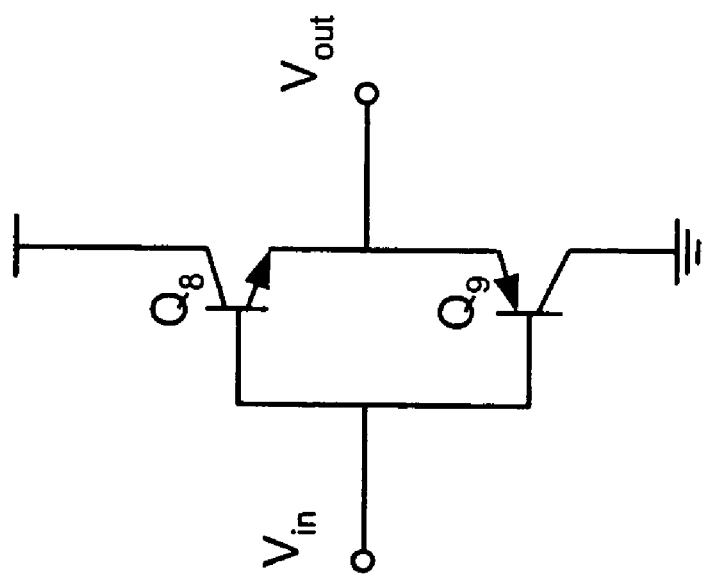
FIG. 3 is an electrical schematic of a prior art class B output stage that operates in a push-pull fashion.

The following description of preferred embodiments is merely exemplary in nature and is in no way intended to limit the invention, its application, or uses. The same reference numerals are used to indicate similar elements or features throughout the drawings.

Figure 4:
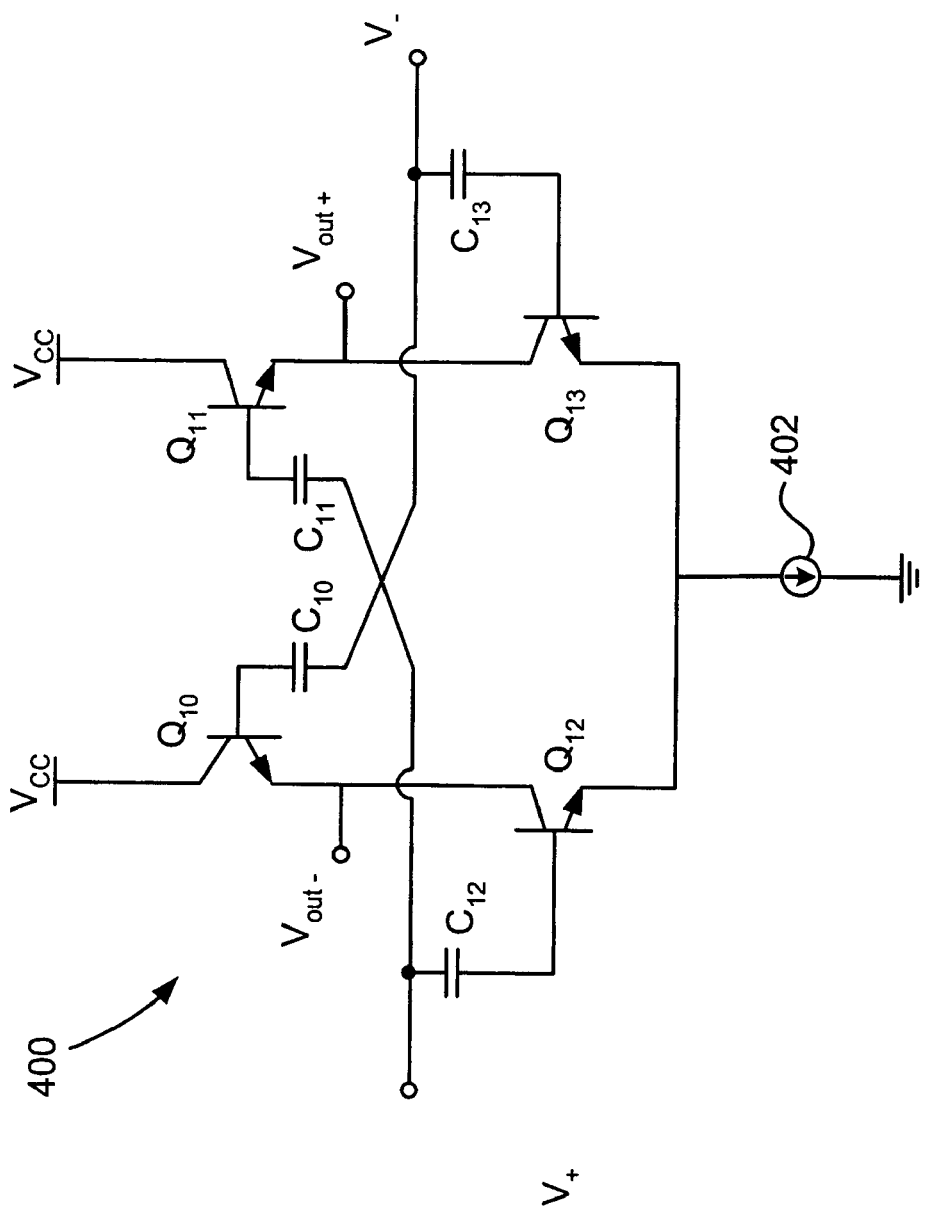
FIG. 4 is an electrical schematic of a buffer/amplifier circuit according to one embodiment of the present invention.

A buffer circuit according to one preferred embodiment of the present invention is illustrated in FIG. 4 and indicated generally by reference numeral 400. As shown in FIG. 4, the buffer circuit 400 includes four bipolar junction transistors $Q_{10}$, $Q_{11}$, $Q_{12}$, and $Q_{13}$. A positive input terminal $V_+$ is coupled to the base of transistor $Q_{11}$ as well as to the base of transistor $Q_{12}$. A negative input terminal $V_-$ is coupled to the base of transistor $Q_{10}$ as well as to the base of transistor $Q_{13}$. A positive output terminal $V_{out+}$ is coupled to the emitter of transistor $Q_{11}$ and to the collector of transistor $Q_{13}$. A negative output terminal $V_{out-}$ is coupled to the emitter of transistor $Q_{10}$ and to the collector of transistor $Q_{12}$. The collectors of transistors $Q_{10}$, $Q_{11}$ are coupled to supply voltage terminals $V_{CC}$, and the emitters of transistors $Q_{12}$, $Q_{13}$ are both coupled to one side of a bias current source 402. The other side of the current source 402 is coupled to ground.

As shown in FIG. 4, the positive input terminal $V_+$ is preferably coupled to the bases of transistors $Q_{11}$, $Q_{12}$ through speed-up capacitors $C_{11}$, $C_{12}$, respectively. Similarly, the negative input terminal $V_-$ is preferably coupled to the bases of transistors $Q_{10}$, $Q_{13}$ through speed-up capacitors $C_{10}$, $C_{13}$, respectively.

In operation, transistors $Q_{10}$ and $Q_{11}$ essentially act as emitter followers, while transistors $Q_{12}$ and $Q_{13}$ function as a switch pair transconductance. The combined action of these two sets of transistors enhances the buffering action that each provides.

Assuming, for example, a sinusoidal input signal is applied across the positive and negative input terminals $V_+$, $V_-$ and a load is connected across the positive and negative output terminals $V_{out+}$, $V_{out-}$, the circuit 400 of FIG. 4 generally operates as follows. When the positive input terminal $V_+$ is pulled high, transistors $Q_{11}$ and $Q_{12}$ are biased on, while transistors $Q_{10}$ and $Q_{13}$ are biased off. Therefore, transistor $Q_{11}$ pushes current to the load via the positive output terminal $V_{out+}$ while, at the same time, transistor $Q_{12}$ pulls current from the load via negative output terminal $V_{out-}$. Conversely, when the negative input terminal $V_-$ is pulled high, transistors $Q_{10}$ and $Q_{13}$ are biased on, while transistors $Q_{11}$ and $Q_{12}$ are biased off. Therefore, transistor $Q_{10}$ pushes current to the load via the negative output terminal $V_{out-}$ while, at the same time, transistor $Q_{13}$ pulls current from the load via the positive output terminal $V_{out+}$. Thus, the circuit of FIG. 4 simultaneously pushes current to one side of a load while pulling current from the other side of the load. In this manner, the load can be readily charged (or discharged), including when the load is capacitive and/or driven at high frequency.

By switching off transistor $Q_{13}$ while transistor $Q_{11}$ pushes current to the load via the positive output terminal $V_{out+}$, transistor $Q_{11}$ is isolated from a path of the bias current, which generally flows at such time from the negative output terminal $V_{out-}$ to ground through the transistor $Q_{12}$ and the bias current source 402. Similarly, by switching off transistor $Q_{12}$ while transistor $Q_{10}$ pushes current to the load via the negative output terminal $V_{out-}$, transistor $Q_{10}$ is isolated from the path of the bias current, which generally flows at such time from the positive output terminal $V_{out+}$ to ground through the transistor $Q_{13}$ and the bias current source 402. Thus, unlike many prior art buffers, the transistor supplying current to one of the output terminals at a given time is not also required to supply the bias current. Accordingly, less current consumed.

Figure 5:
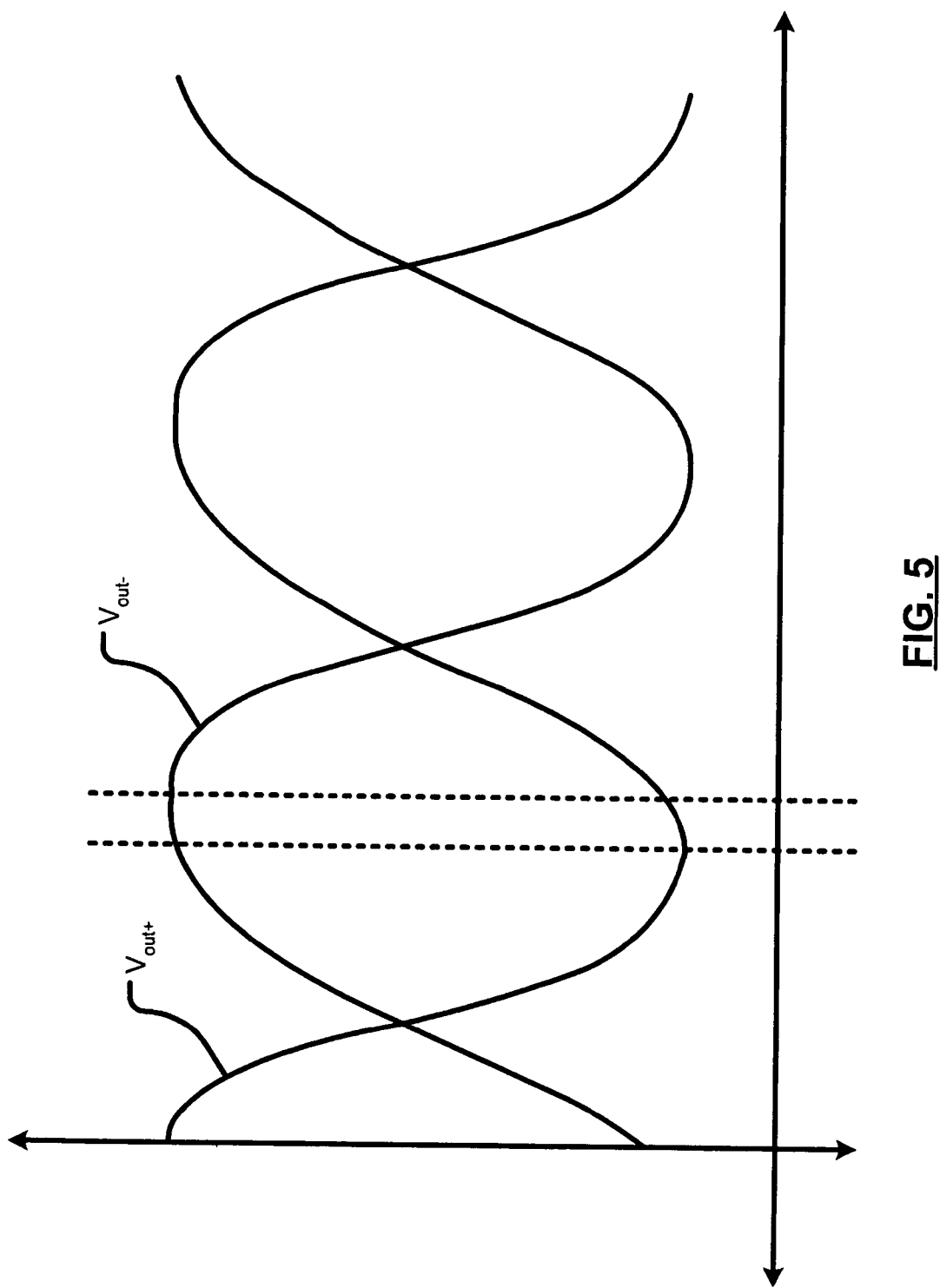
FIG. 5 is a waveform diagram illustrating a time lag between the output signals of the circuit of FIG. 4 when driving a capacitive load.

It should also be noted that, during operation of the circuit of FIG. 4, there is a small period of time when transistors $Q_{11}$ and $Q_{13}$ are both conducting (and essentially interfering with one another), and a small period of time when transistors $Q_{10}$ and $Q_{12}$ are both conducting (and essentially interfering with one another). This is because the lower transistors $Q_{12}$ and $Q_{13}$ are generally biased on as their input signals climb above the reference voltage (i.e., the zero crossing), whereas the upper transistors $Q_{10}$ and $Q_{11}$ are generally biased on as their input signals rise above their peak negative values (i.e., before the zero crossing). As a result, the voltages at the positive and negative output terminals $V_{out+}$, $V_{out-}$ are not exactly 180 degrees out of phase, as shown in FIG. 5. In other words, a positive voltage peak at one of the output terminals does not fully coincide with, but rather slightly lags in time, a negative voltage peak at the other output terminal. The positions of the peaks are a function of the capacitive load. This effect does not occur when the circuit is resistively loaded instead of capacitively loaded.

Figure 6:
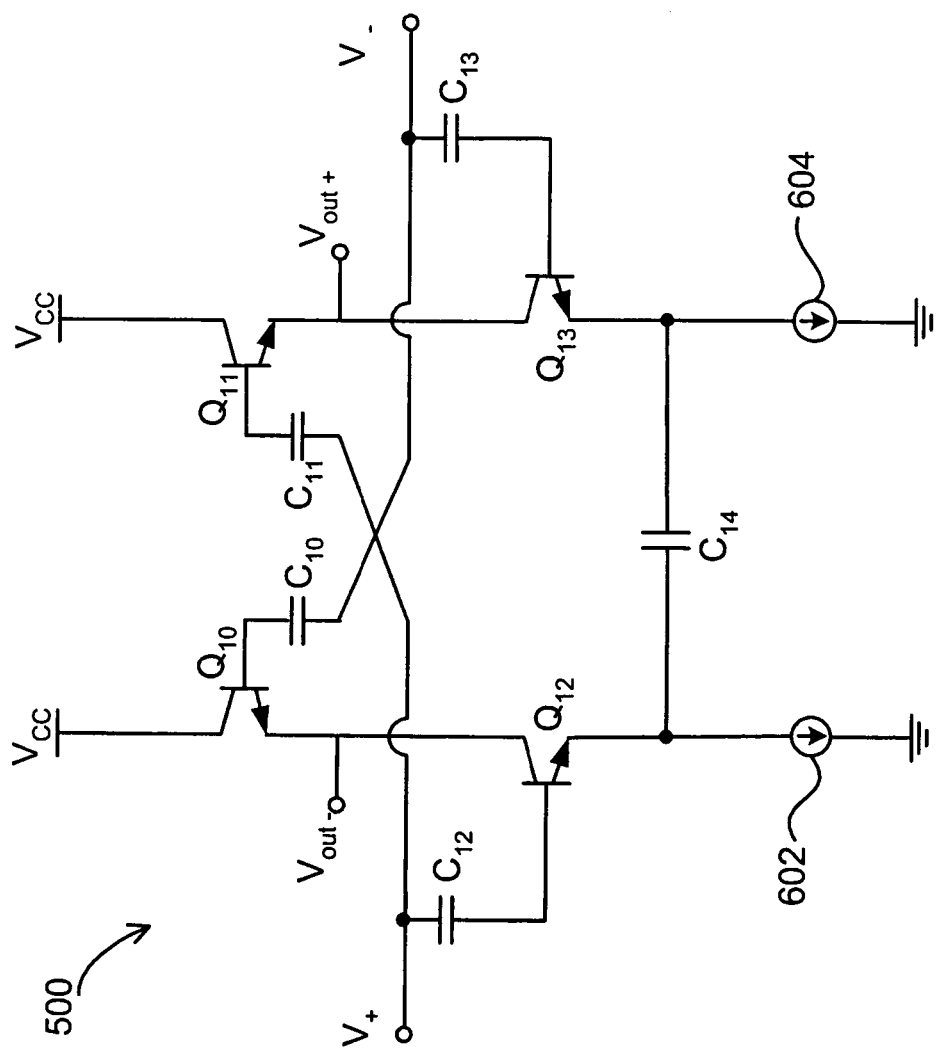
FIG. 6 is an electrical schematic of a buffer/amplifier circuit according to another embodiment of the present invention employing a degeneration capacitor.
Figure 7:
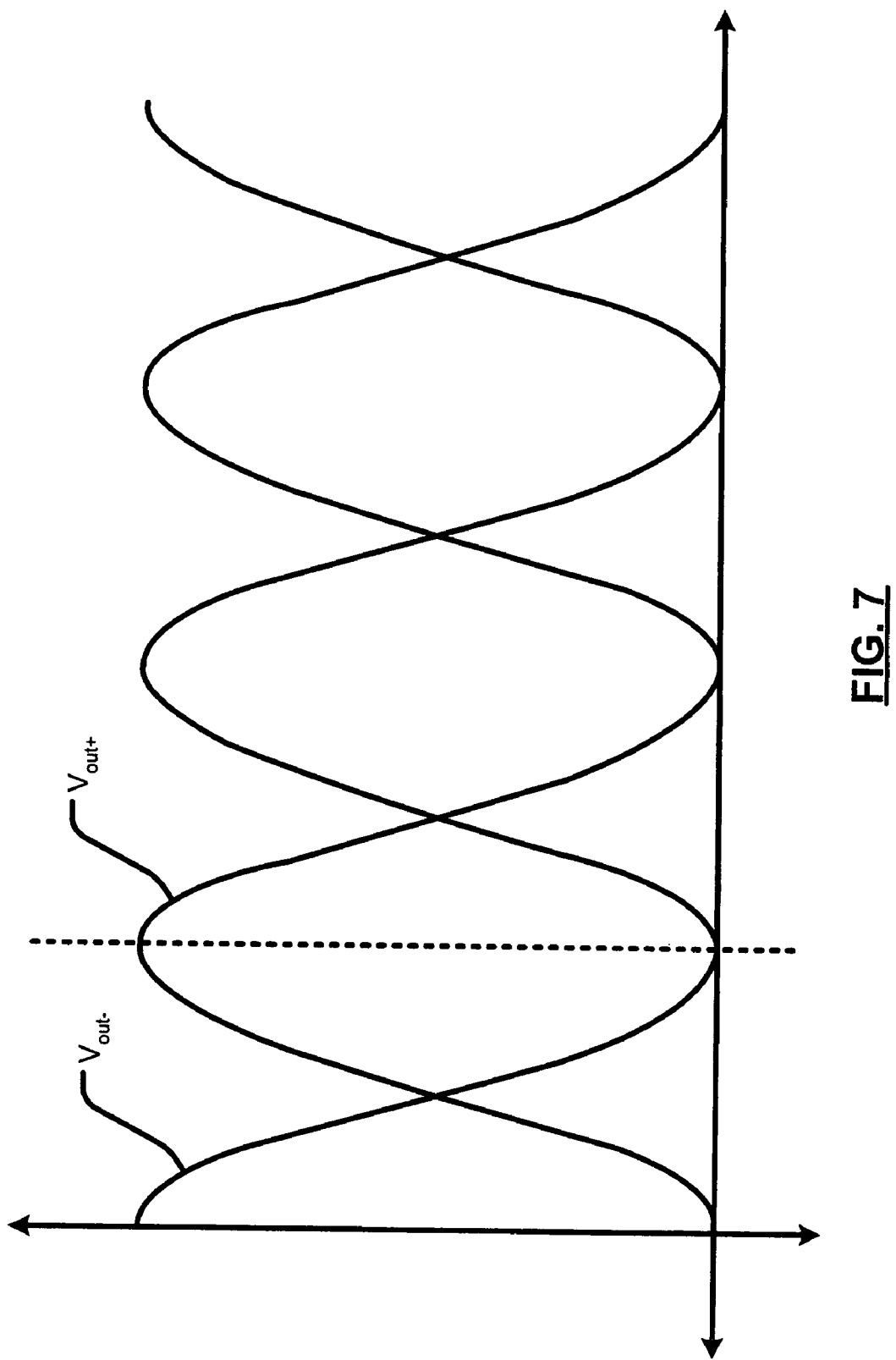
FIG. 7 is a waveform diagram illustrating the effect of a degeneration capacitor on the output signals of the circuit of FIG. 6 when driving a capacitive load.

To compensate for the output phase difference illustrated in FIG. 5, a degeneration capacitor $C_{14}$ can be coupled between the emitters of transistors $Q_{12}$ and $Q_{13}$, as shown in FIG. 6. Additionally, in the embodiment of FIG. 6, two bias current sources 602, 604 are provided in place of the single current source 402 of FIG. 4. As shown in FIG. 6, one of the current sources 602 is coupled to the emitter of transistor $Q_{12}$, and the other current source 604 is coupled to the emitter of transistor $Q_{13}$. By including the degeneration capacitor $C_{14}$ in the circuit 600 of FIG. 6, transistors $Q_{12}$ and $Q_{13}$ are capacitively degenerated to produce sufficient phase shift such that transistors $Q_{11}$ and $Q_{13}$ are not biased on at the same time, and transistors $Q_{10}$ and $Q_{12}$ are not biased on at the same time. As a result, the voltages at the output terminals $V_{out+}$, $V_{out-}$ are substantially 180 degrees out of phase, as illustrated in FIG. 7.

Figure 8:
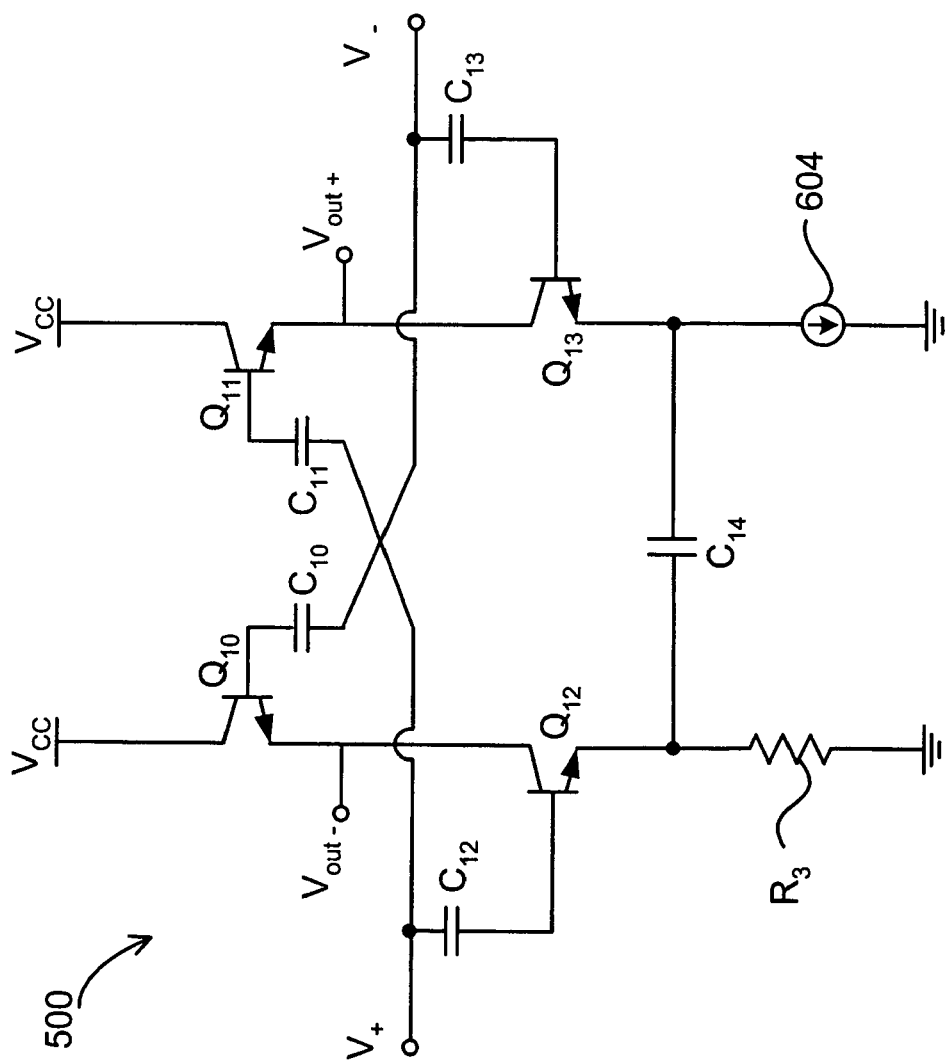
FIG. 8 is an electrical schematic of a buffer/amplifier circuit according to another embodiment of the present invention.

As an alternative to the circuit 600 of FIG. 6, which employs two current sources 602 and 604, the current source 602 can be replaced with a suitable resistor $R_3$, as shown in FIG. 8. If the values of resistor $R_3$ and capacitor $C_{14}$ are relatively large, the impedance of the capacitor $C_{14}$ will dominate at high frequency and the circuit 800 will function much like the circuit 600 of FIG. 6.

Those skilled in the art will appreciate that the buffer circuits of FIGS. 4, 6 and 8 can be readily configured as amplifiers, rather than unity gain buffers, if desired for any given application of the invention.

Preferably, transistors $Q_{10}$ and $Q_{11}$, as well as transistors $Q_{12}$ and $Q_{13}$, are matched transistor pairs having substantially the same operating characteristics. Even more preferably, all four transistors $Q_{10}$–$Q_{13}$ are matched and have the same performance characteristics.

For the specific embodiments shown in FIGS. 4, 6 and 8, transistors $Q_{10}$–$Q_{13}$ are NPN bipolar junction transistors (BJTs). It should be understood, however, that other types of transistors may be employed without departing the scope of the present invention.

One preferred application for the buffer/amplifier circuits of FIGS. 4, 6 and 8 is in video buffering, including buffering of video clock signals. The buffer/amplifier circuits may also be used to drive off-chip capacitive loads. Those skilled in the art will appreciate, however, that the teachings of the present invention are not so limited, and can be applied in a wide variety of applications.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A differential circuit comprising:
   first, second, third, and fourth transistors each having a control terminal, a first terminal and a second terminal;
   a first input terminal that communicates with the control terminals of the second and third transistors;
   a second input terminal that communicates with the control terminals of the first and fourth transistors;
   a first output terminal that communicates with the second terminal of the second transistor and the first terminal of the fourth transistor;
   a second output terminal that communicates with the second terminal of the first transistor and the first terminal of the third transistor; and
   first and second capacitances, wherein the first input terminal communicates with the control terminals of the second and third transistors through the first and second capacitances, respectively.

2. The differential circuit of claim 1 further comprising:
   third and fourth capacitances,
   wherein the second input terminal communicates with the control terminals of the first and fourth transistors through the third and fourth capacitances, respectively.

3. The differential circuit of claim 1 further comprising a capacitance that communicates with the second terminals of the third and fourth transistors.

4. The differential circuit of claim 3 further comprising:
   a first bias current source that communicates with the second terminal of the third transistor and one end of the capacitance; and
   a second bias current source that communicates with the second terminal of the fourth transistor and an opposite end of the capacitance.

5. The differential circuit of claim 1 further comprising at least one bias current source that communicates with the second terminals of the third and fourth transistors.

6. The differential circuit of claim 5 further comprising a capacitance that communicates with the second terminals of the third and fourth transistors.

7. The differential circuit of claim 6 wherein the bias current source communicates with one of the second terminal of the third transistor and the second terminal of the fourth transistor through the capacitance.

8. The differential circuit of claim 1 wherein the first terminals of the first and second transistors communicate with one or more supply voltage terminals.

9. The differential circuit of claim 1 wherein the transistors are bipolar junction transistors.

10. The differential circuit of claim 1 wherein the differential circuit implements one of a unity gain buffer and an amplifier.

11. A differential circuit comprising:
    first, second, third, and fourth transistors each having a control terminal, a first terminal and a second terminal;
    a first input terminal that communicates with the control terminals of the second and third transistors;
    a second input terminal that communicates with the control terminals of the first and fourth transistors;
    a first output terminal that communicates with the second terminal of the second transistor and the first terminal of the fourth transistor;
    a second output terminal that communicates with the second terminal of the first transistor and the first terminal of the third transistor; and
    first and second capacitances, wherein the second input terminal communicates with the control terminals of the first and fourth transistors through the first and second capacitances, respectively.

12. The differential circuit of claim 11 further comprising: third and fourth capacitances, wherein the first input terminal communicates with the control terminals of the second and third transistors through the third and fourth capacitances, respectively.

13. The differential circuit of claim 11 further comprising a capacitance that communicates with the second terminals of the third and fourth transistors.

14. The differential circuit of claim 13 further comprising:
a first bias current source that communicates with the second terminal of the third transistor and one end of the capacitance; and
a second bias current source that communicates with the second terminal of the fourth transistor and an opposite end of the capacitance.

15. The differential circuit of claim 11 further comprising at least one bias current source that communicates with the second terminals of the third and fourth transistors.

16. The differential circuit of claim 15 further comprising a capacitance that communicates with the second terminals of the third and fourth transistors.

17. The differential circuit of claim 16 wherein the bias current source communicates with one of the second terminal of the third transistor and the second terminal of the fourth transistor through the capacitance.

18. The differential circuit of claim 11 wherein the first terminals of the first and second transistors communicate with one or more supply voltage terminals.

19. The differential circuit of claim 11 wherein the transistors are bipolar junction transistors.

20. The differential circuit of claim 11 wherein the differential circuit implements one of a unity gain buffer and an amplifier.

* * * * *